(12) United States Patent
Kim et al.

(10) Patent No.: US 10,720,408 B2
(45) Date of Patent: Jul. 21, 2020

(54) HIGH-SPEED SEMICONDUCTOR MODULES

(71) Applicant: Samsung Electronics Co., Ltd., Suwon-si, Gyeonggi-do (KR)

(72) Inventors: Kyoungsoo Kim, Hwaseong-si (KR); SunWon Kang, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/684,569

(22) Filed: Nov. 14, 2019

(65) Prior Publication Data

US 2020/0083195 A1 Mar. 12, 2020

Related U.S. Application Data

(63) Continuation of application No. 15/264,579, filed on Sep. 13, 2016, now Pat. No. 10,522,506.

(30) Foreign Application Priority Data

Dec. 17, 2015 (KR) .......................... 10-2015-0181147

(51) Int. Cl.
*H01L 23/48* (2006.01)
*H01L 25/065* (2006.01)
(Continued)

(52) U.S. Cl.
CPC .... *H01L 25/0652* (2013.01); *H01L 23/49816* (2013.01); *H01L 23/49827* (2013.01);
(Continued)

(58) Field of Classification Search
CPC .................................................. H01L 25/0652
(Continued)

(56) References Cited

U.S. PATENT DOCUMENTS 7,529,273 B2 * 5/2009 James ................. G06F 13/1684
365/226
8,347,057 B2 1/2013 Nishio et al.
(Continued)

FOREIGN PATENT DOCUMENTS

| JP | 2012533793 A | 12/2012 |
|---|---|---|
| KR | 20130078455 A | 7/2013 |
| KR | 20130093455 A | 8/2013 |

*Primary Examiner* — Ajay Arora
(74) *Attorney, Agent, or Firm* — Renaissance IP Law Group LLP

(57) ABSTRACT

A semiconductor module, comprising: a module substrate with an electric connection element; at least one semiconductor package provided on the module substrate, the at least one semiconductor package including a plurality of semiconductor chips; and a connection region electrically connecting the semiconductor package to the module substrate, wherein the connection region comprises: a first region electrically connected between data signal terminals of a first chip of the semiconductor chips of the semiconductor package and the module substrate; a second region electrically connected between data signal terminals of a second chip of the semiconductor chips of the semiconductor package and the module substrate; and a third region electrically connected between command/address signal terminals of both the first and second chips of the semiconductor package and the module substrate, wherein the first region is closer to the electric connection element of the module substrate, compared with the third region.

20 Claims, 21 Drawing Sheets

(51) Int. Cl.
  *H01L 23/498* (2006.01)
  *H01L 23/50* (2006.01)
  *H01L 25/10* (2006.01)

(52) U.S. Cl.
  CPC ............ *H01L 23/50* (2013.01); *H01L 25/105* (2013.01); *H01L 2224/16225* (2013.01); *H01L 2224/32145* (2013.01); *H01L 2224/32225* (2013.01); *H01L 2224/48227* (2013.01); *H01L 2224/73265* (2013.01); *H01L 2225/0651* (2013.01); *H01L 2225/0652* (2013.01); *H01L 2225/06541* (2013.01); *H01L 2225/06586* (2013.01); *H01L 2225/107* (2013.01); *H01L 2924/15311* (2013.01); *H01L 2924/181* (2013.01)

(58) Field of Classification Search
  USPC ......................................................... 257/773
  See application file for complete search history.

(56) References Cited

U.S. PATENT DOCUMENTS

| | | |
|---|---|---|
| 8,787,060 B2 | 7/2014 | Lee |
| 8,930,647 B1 | 1/2015 | Smith |
| 9,000,599 B2 | 4/2015 | Raorane et al. |
| 9,058,897 B2 | 6/2015 | Yu et al. |
| 2002/0079568 A1 | 6/2002 | Degani et al. |
| 2005/0006784 A1* | 1/2005 | Nakayama .......... H01L 23/3114 257/777 |
| 2006/0273455 A1 | 12/2006 | Williams et al. |
| 2010/0078809 A1* | 4/2010 | Lambrecht ............ G11C 5/025 257/723 |
| 2011/0055616 A1 | 3/2011 | Nishio et al. |
| 2012/0106228 A1 | 5/2012 | Lee |
| 2013/0170274 A1 | 7/2013 | Yu et al. |
| 2014/0040568 A1 | 2/2014 | Lee et al. |
| 2014/0217586 A1 | 8/2014 | Kim et al. |
| 2014/0332975 A1 | 11/2014 | Raorane et al. |
| 2015/0138895 A1 | 5/2015 | Ware et al. |

* cited by examiner

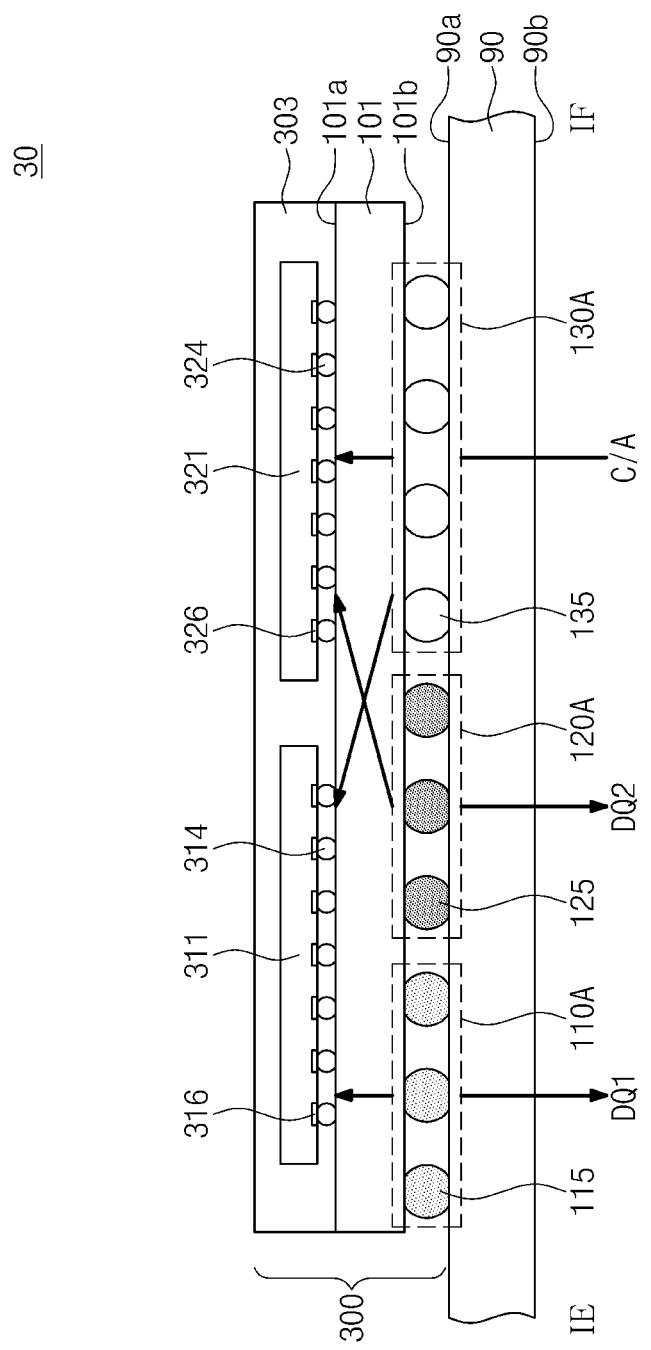

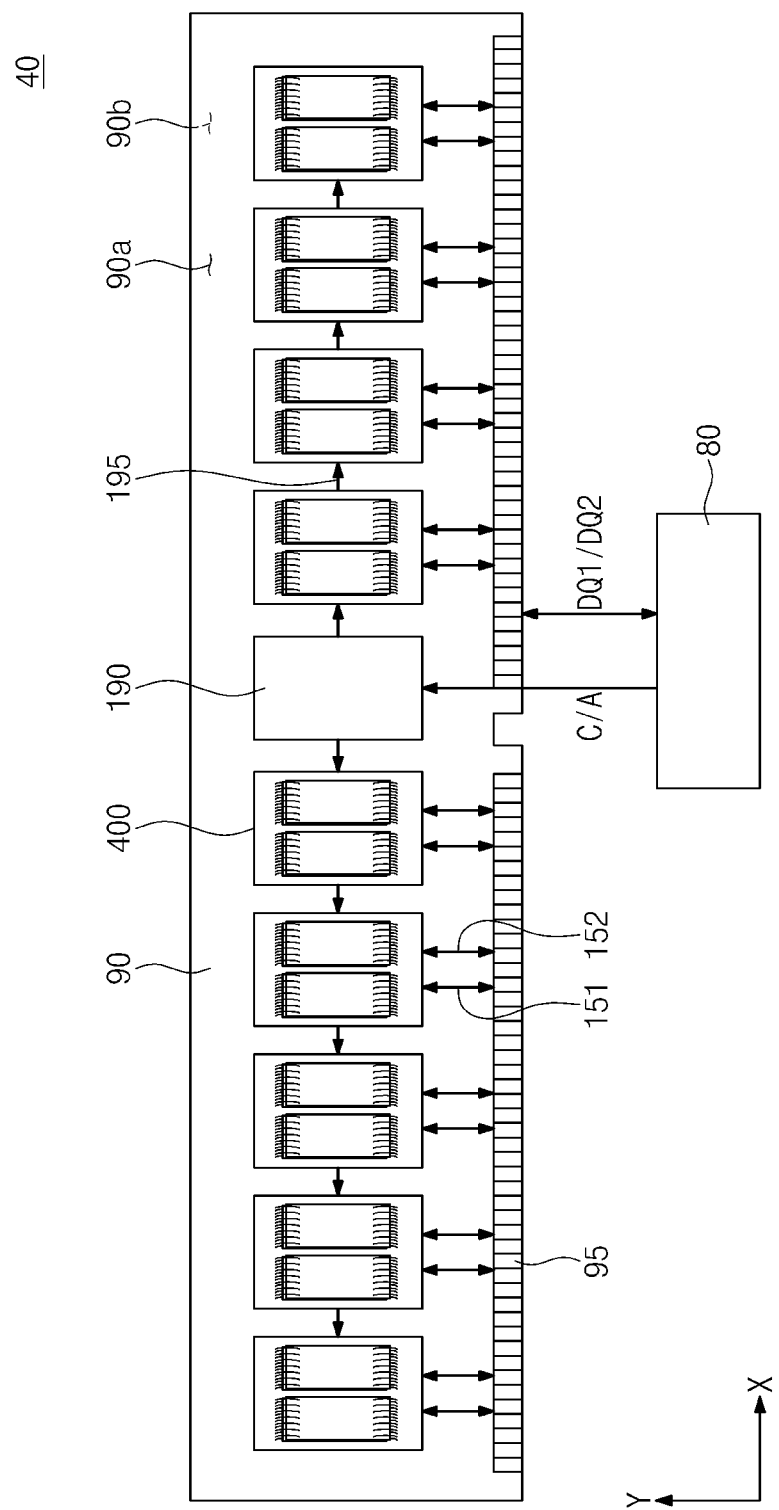

HIGH-SPEED SEMICONDUCTOR MODULES

CROSS-REFERENCE TO RELATED APPLICATIONS

This application is a continuation of U.S. patent application Ser. No. 15/264,579, filed on Sep. 13, 2016, which claims priority under 35 U.S.C. § 119 to Korean Patent Application No. 10-2015-0181147, filed on Dec. 17, 2015, in the Korean Intellectual Property Office, the entire contents of which are hereby incorporated by reference.

BACKGROUND OF THE INVENTION

The present disclosure relates to a semiconductor device, and in particular, to high-speed semiconductor modules.

In a data processing system (e.g., computer or communication system), a semiconductor module with multiple semiconductor packages is generally provided on a module board. A delay time of signals to be transmitted from or to the semiconductor package is dependent on, or proportional to, a distance from a connector of the module board, and thus, the semiconductor module may suffer from a reduced processing speed or signal distortion. To overcome these technical issues, various semiconductor module structures are being studied.

SUMMARY

Some embodiments include a semiconductor module, comprising: a module substrate with an electric connection element; at least one semiconductor package provided on the module substrate, the at least one semiconductor package including a plurality of semiconductor chips; and a connection region electrically connecting the semiconductor package to the module substrate, wherein the connection region comprises: a first region electrically connected between data signal terminals of a first chip of the semiconductor chips of the semiconductor package and the module substrate; a second region electrically connected between data signal terminals of a second chip of the semiconductor chips of the semiconductor package and the module substrate; and a third region electrically connected between command/address signal terminals of both the first and second chips of the semiconductor package and the module substrate, wherein the first region is closer to the electric connection element of the module substrate, compared with the third region.

Some embodiments include a semiconductor module, comprising: a module substrate; a plurality of semiconductor packages arranged in a first direction on the module substrate; an electric connection element extending on the module substrate in the first direction; wherein each of the semiconductor packages comprises: a package substrate having a top surface and a bottom surface opposite to each other; and a plurality of semiconductor chips provided on the top surface of the package substrate and arranged in a second direction crossing the first direction; wherein: the semiconductor chips are mounted in common on the top surface of the package substrate; the first and second directions are parallel to the top surface of the package substrate; and the second direction is a direction extending away from the electric connection element.

Some embodiments include a semiconductor module, comprising a plurality of semiconductor packages provided on a module substrate with an electric connection element, wherein each of the semiconductor package comprises: a package substrate having a bottom surface and a top surface opposite to each other, the bottom surface facing the module substrate; a plurality of semiconductor chips mounted in common on the top surface of the package substrate such that their distances from the electric connection element of the module substrate are different from each other, when measured on the top surface of the package substrate; and a plurality of electric connection elements of the package substrate provided on the bottom surface of the package substrate to electrically connect the semiconductor chips to the module substrate, wherein the plurality of electric connection elements of the package substrate comprise: a plurality of first connection elements electrically connected to data signal terminals of the semiconductor chips; and a plurality of second connection elements electrically connected to command/address signal terminals of the semiconductor chips, wherein the package substrate comprises: a first connection region that is provided on the bottom surface of the package substrate and on which the first connection elements are arranged; and a second connection region that is provided on the bottom surface of the package substrate and on which the second connection elements are arranged, wherein the first connection region is closer to the electric connection element of the module substrate than the second connection region.

BRIEF DESCRIPTION OF THE DRAWINGS

Embodiments will be more clearly understood from the following brief description taken in conjunction with the accompanying drawings. The accompanying drawings represent non-limiting, example embodiments as described herein.

FIG. 4D is a sectional view taken along line IE-IF of FIG. 4C.

FIG. 5A is a plan view illustrating a semiconductor module according to some embodiments.

DETAILED DESCRIPTION

Figure 1A:
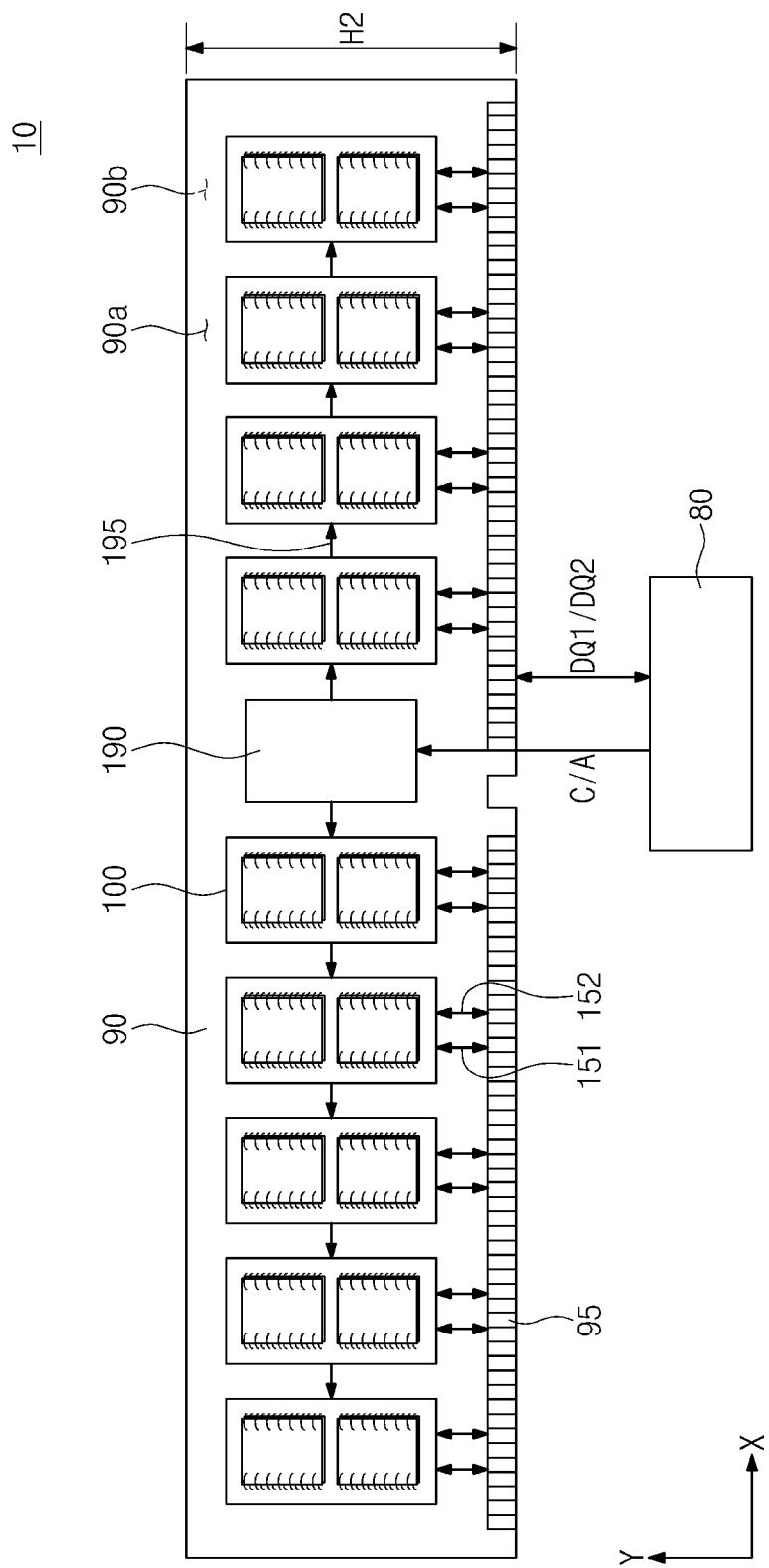
FIG. 1A is a plan view illustrating a semiconductor module according to some embodiments.
Figure 1B:
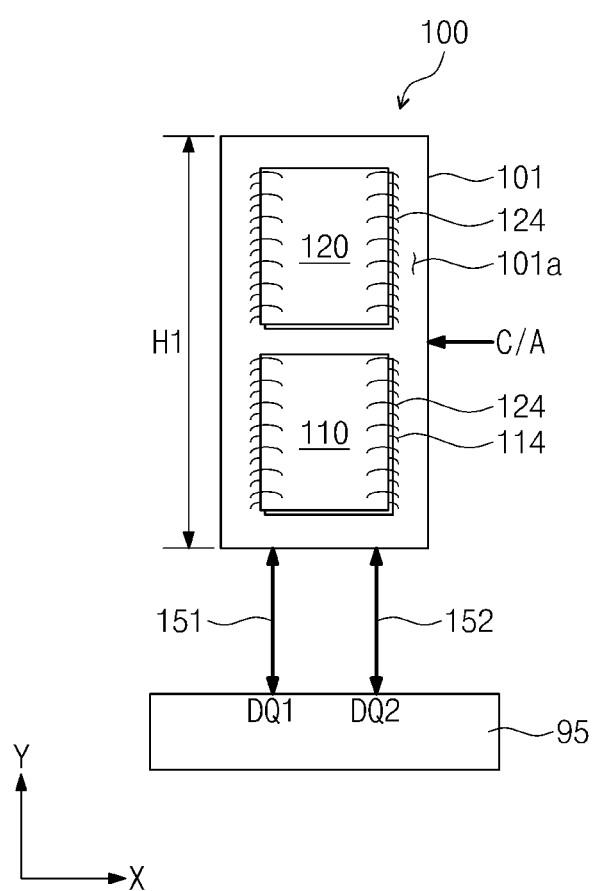
FIG. 1B is a top plan view illustrating a portion (e.g., a semiconductor package) of FIG. 1A.
Figure 1C:
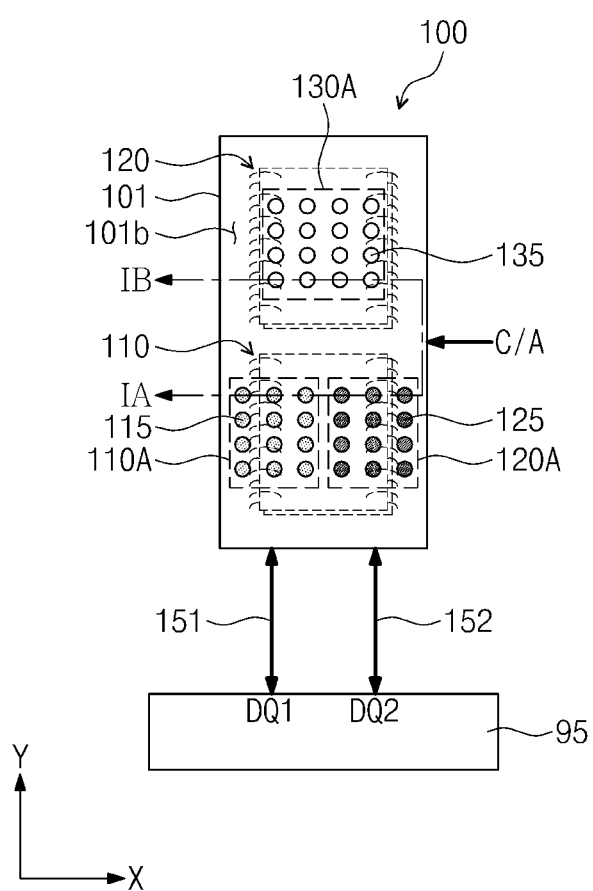
FIG. 1C is a bottom plan view illustrating a portion (e.g., a semiconductor package) of FIG. 1A.
Figure 1D:
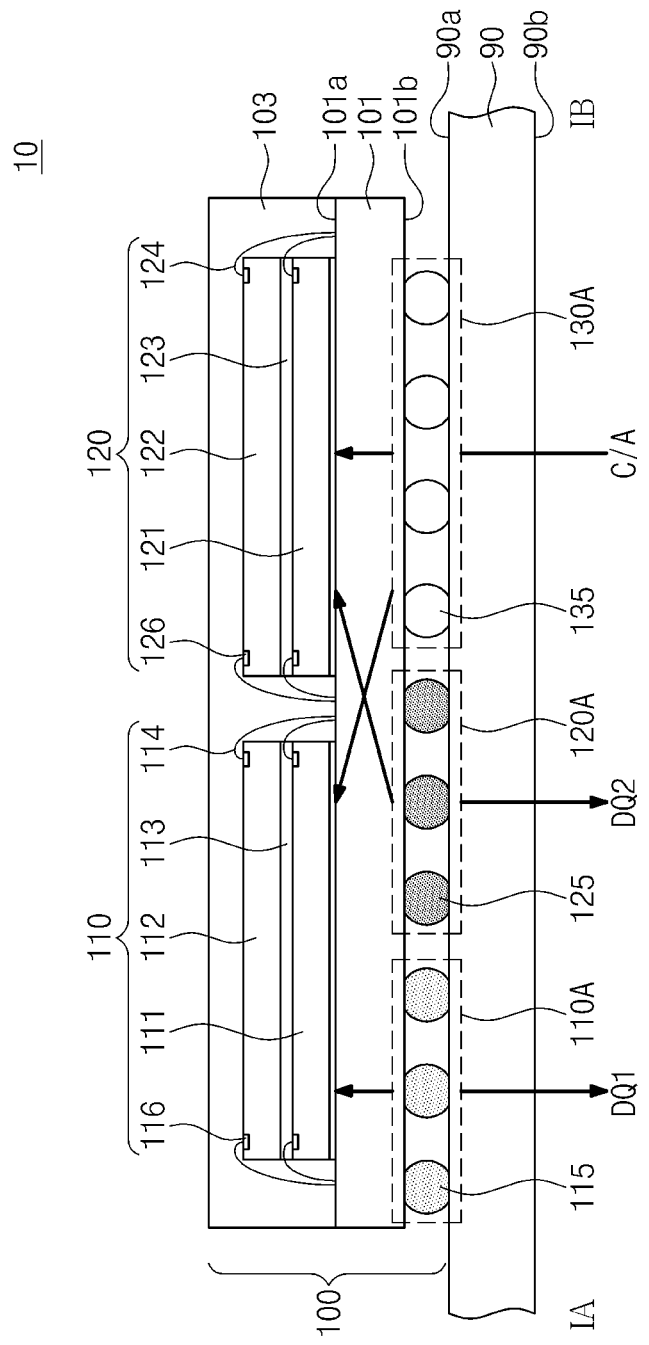
FIG. 1D is a sectional view taken along line IA-IB of FIG. 1C.

FIG. 1A is a plan view illustrating a semiconductor module according to some embodiments. FIG. 1B is a top plan view illustrating a portion (e.g., a semiconductor package) of FIG. 1A. FIG. 1C is a bottom plan view illustrating a portion (e.g., a semiconductor package) of FIG. 1A. FIG. 1D is a sectional view taken along line IA-IB of FIG. 1C.

Referring to FIG. 1A, a semiconductor module 10 may include a module substrate 90 having two opposite surfaces (e.g., a top surface 90a and a bottom surface 90b), at least one semiconductor package 100 provided on the top surface 90a of the module substrate 90, and a connector 95 provided on an edge region of the top surface 90a of the module substrate 90. Arrows 151 and 152 may represent transmission or routing of data signals (e.g., DQ, DQS, DQSB) to be exchanged between the semiconductor package 100 and the connector 95. As used herein, the data signals will be denoted by reference characters "DQ1" and/or "DQ2". For example, the reference characters "DQ1" may include data signals, such as DQ, DQS, and DQSB. The same may be true of the reference characters "DQ2".

The semiconductor module 10 may include a memory module (e.g., a dynamic random access memory (DRAM), static random access memory (SRAM), phase-change random access memory (PRAM), magnetoresistive random access memory (MRAM), ferroelectric random access memory (FeRAM), Resistive Random Access Memory (RRAM), flash memory, or electrically erasable programmable read-only memory (EEPROM) module). For example, the semiconductor module 10 may include multiple semiconductor packages 100, and each of the semiconductor packages 100 may include two or more memory chips. The semiconductor module 10 may further include a buffer chip 190 provided on the top surface 90a of the module substrate 90. The buffer chip 190 may be configured to provide signals (e.g., command signals (CMD), address signals (ADDR), and control signals (CTRL)), which are provided from an external device 80 (e.g., a memory controller), to the semiconductor package 100 in a buffered manner The external device 80 may be configured to use such signals to control reading and writing data from and to the semiconductor package 100. Arrow 195 may represent transmission or routing of non-data signals (e.g., CMD, ADDR, and CTRL) to be transmitted from the external device 80 or the buffer chip 190 to the semiconductor package 100. For brevity, the non-data signals will be referred to as a 'command/address signal C/A'. For example, the command/address signal C/A may include the command signals (CMD), the address signals (ADDR), and the control signals (CTRL) and so on.

The module substrate 90 may have a rectangular shape; for example, a length of the module substrate 90 may be longer in a first direction X than in a second direction Y perpendicular to the first direction X. The semiconductor packages 100 may be spaced apart from each other in the first direction X. The buffer chip 190 may be provided at a center of the top surface 90a of the module substrate 90 or at a region adjacent to the center. The connector 95 may include multiple pads, which are provided on a lower edge region of the top surface 90a of the module substrate 90 and are arranged in the first direction X.

A structure provided on the top surface 90a of the module substrate 90 may be substantially the same as or similar to that on the bottom surface 90b of the module substrate 90. For example, the semiconductor module 10 may further include multiple semiconductor packages 100 provided on the bottom surface 90b of the module substrate 90, and in some embodiments, the semiconductor module 10 may further include a buffer chip 190 provided on the bottom surface 90b of the module substrate 90.

Referring to FIGS. 1B and 1D, the semiconductor package 100 may include a package substrate 101 (e.g., a printed circuit board) having two opposite surfaces (e.g., a top surface 101a and a bottom surface 101b), at least two chip stacks 110 and 120 provided on the top surface 101a of the package substrate 101, and a mold layer 103 covering the chip stacks 110 and 120.

The first chip stack 110 may include a first lower semiconductor chip 111 and a first upper semiconductor chip 112 stacked on the top surface 101a of the package substrate 101. A first adhesive layer 113 may be provided between the first lower semiconductor chip 111 and the package substrate 101 and between the first lower semiconductor chip 111 and the first upper semiconductor chip 112. The first lower semiconductor chip 111 and the first upper semiconductor chip 112 may be electrically connected to each other and/or to the package substrate 101 through first bonding wires 114. Each of the first lower semiconductor chip 111 and the first upper semiconductor chip 112 may include first chip pads 116, to which the first bonding wires 114 are electrically connected. In some embodiments, at least one semiconductor chip may be further stacked on the first upper semiconductor chip 112.

The second chip stack 120 may have a same or similar structure as the first chip stack 110. For example, the second chip stack 120 may include a second lower semiconductor chip 121, a second upper semiconductor chip 122, a second adhesive layer 123, second bonding wires 124, and second chip pads 126 similar to the corresponding structures of the first chip stack 110.

The semiconductor chips 111, 112, 121, and 122 may have the same structure or may be of the same kind; for example, all of the semiconductor chips 111, 112, 121, and 122 may be memory chips of the same kind. In some embodiments, at least one of the semiconductor chips 111, 112, 121, and 122 may be configured to have a structure different from the others. Although only two chip stacks 110 and 120 have been used as examples, in other embodiments, more chip stacks may be similarly mounted on the package substrate 101.

According to this embodiment, as shown in FIG. 1B, the first and second chip stacks 110 and 120 may be mounted together on the single package substrate 101. The first and second chip stacks 110 and 120 may be arranged in the second direction Y on the single package substrate 101. Accordingly, it is possible to reduce a size (e.g., a length H1 in the second direction Y) of the semiconductor package 100. Each of the first and second bonding wires 114 and 124 may extend in the first direction X. This may make it possible to reduce a space between the first and second chip stacks 110 and 120, and thus, the size H1 of the semiconductor package 100 can be further reduced. Since the size H1 of the semiconductor package 100 is reduced, it is possible to reduce a size H2 of the semiconductor module 10 of FIG. 1A in the second direction Y.

Referring to FIGS. 1C and 1D, the semiconductor module 10 may include multiple connection regions 110A, 120A, and 130A, which are provided on the bottom surface 101b of the package substrate 101 and include connection elements 115, 125, and 135, respectively, which are used to electrically connect the semiconductor package 100 to the module substrate 90. The connection regions 110A, 120A, and 130A may include a first data connection region 110A and a second data connection region 120A, which are respectively used as transmission paths of the data signals DQ1 and DQ2 to be transmitted from and/or to the semiconductor package 100, and a common connection region 130A, which is used as a transmission path of the command/address signal C/A to be transmitted to the semiconductor package 100.

The first data connection region 110A may include multiple first connection elements 115, which are used as transmission paths of the first data signal DQ1 to be transmitted between the first chip stack 110 and the connector 95. The first connection elements 115 may be electrically connected to the first chip pads 116 through the first bonding wires 114. Some of the first chip pads 116 may be data signal terminals configured to transmit and/or receive the first data signal DQ1. The second data connection region 120A may include multiple second connection elements 125, which are used as transmission paths of the second data signal DQ2 to be transmitted between the second chip stack 120 and the connector 95. The second connection elements 125 may be electrically connected to the second chip pads 126 through the second bonding wires 124. Some of the second chip pads 126 may be data signal terminals configured to transmit and/or receive the second data signal DQ1. The common connection region 130A may include multiple third connection elements 135, which are used as transmission paths of the command/address signal C/A to be transmitted to the semiconductor package 100. The third connection elements 135 may be electrically connected to the first chip pads 116 and the second chip pads 126. Some of the first chip pads 116 and the second chip pads 126 may be command/address signal terminals configured to transmit and/or receive the command/address signal C/A. The first to third connection elements 115, 125, and 135 may include, for example, solder bumps or solder balls, which are provided between the bottom surface 101b of the package substrate 101 and the top surface 90a of the module substrate 90; however, in other embodiments, different structures may be used for the first to third connection elements 115, 125, and 135.

A pair of the first and second chip stacks 110 and 120 may be configured to share the command/address signal C/A. This may make it possible to reduce the number of the third connection elements 135. The command/address signal C/A to be transmitted to the semiconductor package 100 may be transmitted to one of the first and second chip stacks 110 and 120 through at least one of the third connection elements 135. For example, the command/address signal C/A may be transmitted to at least one the semiconductor chips 111, 112, 121, and 122, which is selected by at least one (e.g., a chip select ball) of the third connection elements 135. The data signals DQ1 and DQ2 may be transmitted to corresponding ones of the semiconductor chips 111, 112, 121, and 122 through corresponding ones of the connection elements 115 and 125.

Each of the first and second data connection regions 110A and 120A may be overlapped with at least a portion of the first chip stack 110, and the common connection region 130A may be overlapped with at least a portion of the second chip stack 120. However, embodiments are not limited thereto. For example, the common connection region 130A may be overlapped with at least a portion of the first chip stack 110.

According to this embodiment, at least one of the first and second data connection regions 110A and 120A may be closer to the connector 95, compared with the common connection region 130A. For example, the first and second data connection regions 110A and 120A may be arranged in the first direction X on the bottom surface 101b of the package substrate 101 and may be provided adjacent to the connector 95. Since the first data connection region 110A is adjacent to the connector 95, it is possible to reduce a length of the first routing 151 between the connector 95 and the first chip pads 116, which are electrically connected to the first connection elements 115. The reduction in length of the first routing 151 may make it possible to realize faster transmission or exchange of the first data signal DQ1 between the first chip stack 110 and the connector 95. Since the second data connection region 120A is positioned similarly, transmission or exchange of the second data signal DQ2 between the second chip stack 120 and the connector 95 may also be improved.

In some embodiments, the semiconductor package 100 may further include a third chip stack and a third data connection region, and here, the third data connection region may be used as a signal path for third data signals to be transmitted to the third chip stack. The third chip stack in conjunction with the first and second chip stacks 110 and 120 may be arranged in the second direction Y. The third data connection region in conjunction with the first and second data connection regions 110A and 120A may be arranged in the first direction X. In some embodiments, all data connection regions of the semiconductor package 100 may be arranged along the X direction so that each is adjacent to the connector 95.

As used herein, each of the first and second routings 151 and 152 may be used to refer to a "signal transmission" or a "signal transmission path", but embodiments are not limited thereto. For example, the first routing 151 may represent signal lines between the first connection elements 115 and the connector 95, and the second routing 152 may represent signal lines between the second connection elements 125 and the connector 95.

Figure 2A:
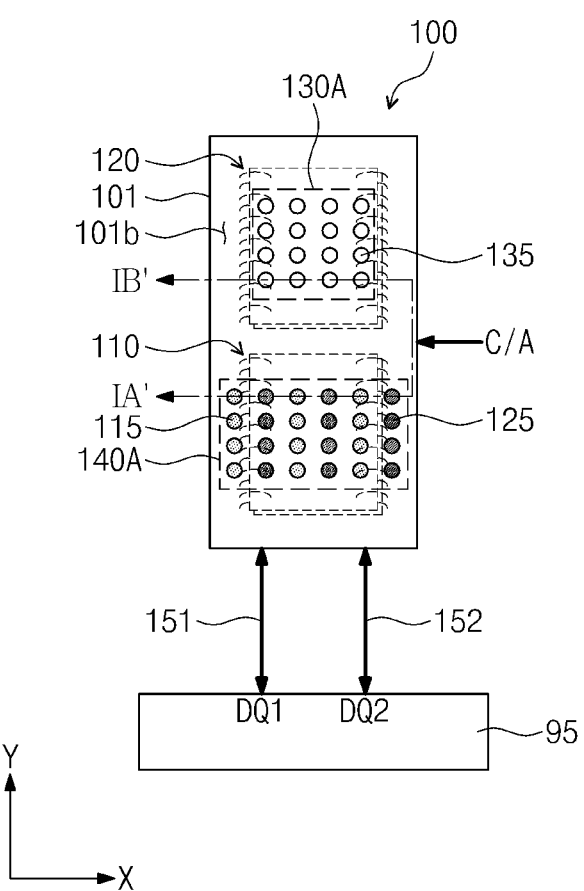
FIG. 2A is a bottom plan view illustrating a modified example of FIG. 1C.
Figure 2B:
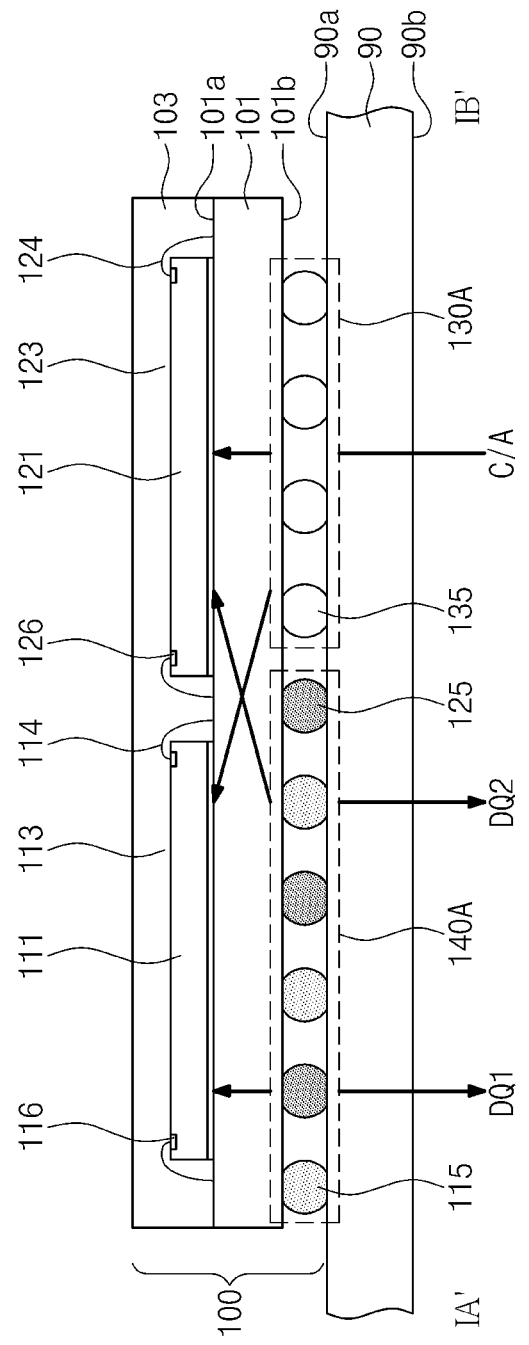
FIG. 2B is a sectional view taken along line IA'-IB' of FIG. 2A illustrating a modified example of FIG. 1D.

FIG. 2A is a bottom plan view illustrating a modified example of FIG. 1C. FIG. 2B is a sectional view taken along line IA' -IB' of FIG. 2A illustrating a modified example of FIG. 1D.

Referring to FIG. 2A, the common connection region 130A and a mixed data connection region 140A may be provided on the bottom surface 101b of the package substrate 101. Here, the common connection region 130A may be used as a transmission path of the command/address signal C/A, and the mixed data connection region 140A may be provided to be adjacent to the connector 95, closer than the common connection region 130A, and may be used as transmission paths of the data signals DQ1 and DQ2. The mixed data connection region 140A may include multiple the first connection elements 115, which are provided to electrically connect the first chip stack 110 to the connector 95, and multiple the second connection elements 125, which are provided to electrically connect the second chip stack 120 to the connector 95. According to this embodiment, the first connection elements 115 and the second connection elements 125 may be mixed and provided in the single mixed data connection region 140A.

Referring to FIG. 2B, the semiconductor package 100 may have a single-layered structure. For example, the semiconductor package 100 may include the first lower semiconductor chip 111 and the second lower semiconductor chip 121 provided on the top surface 101a of the package substrate 101. The first lower semiconductor chip 111 and the second lower semiconductor chip 121 may be connected to the package substrate 101 through bonding wires, as described previously with reference to FIG. 1C and 1D. However, in other embodiments, the chip stacks may be used in place of one or more of the single semiconductor chips 111 and 121 as described above.

Figure 3A:
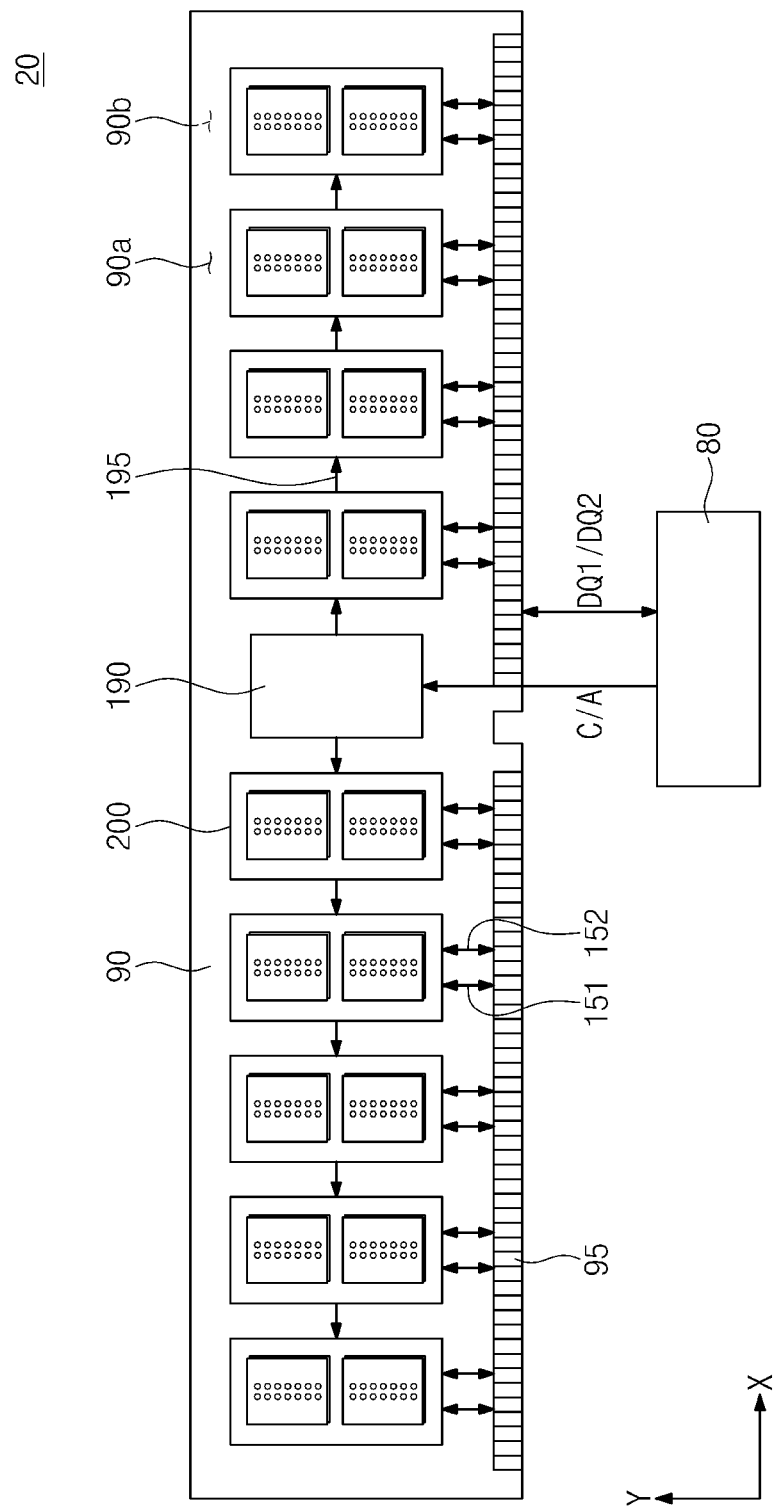
FIG. 3A is a plan view illustrating a semiconductor module according to some embodiments.
Figure 3B:
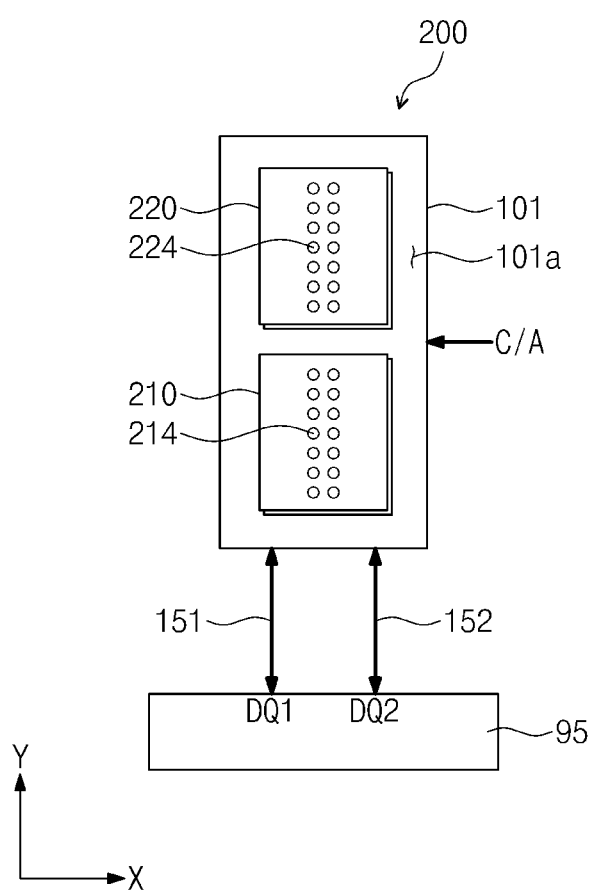
FIG. 3B is a top plan view illustrating a portion (e.g., a semiconductor package) of FIG. 3A.
Figure 3C:
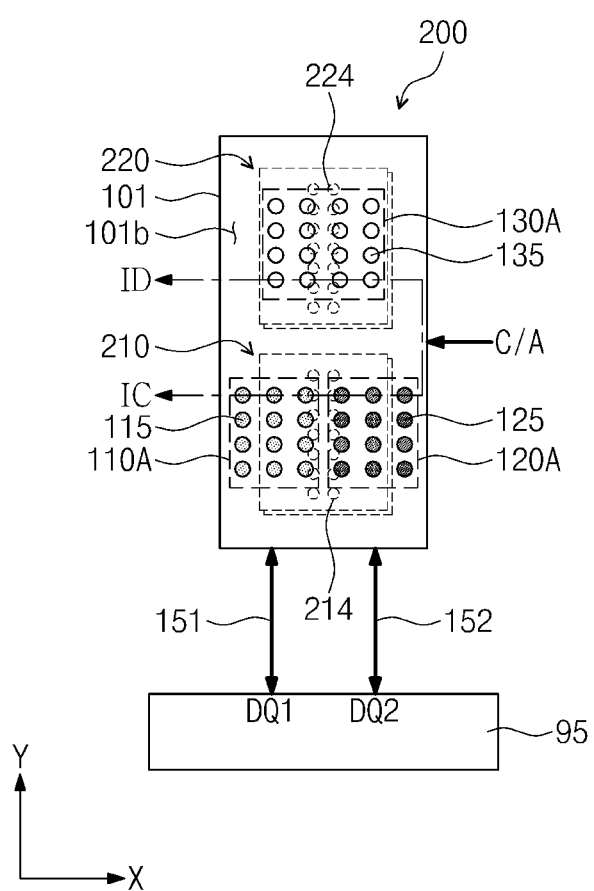
FIG. 3C is a bottom plan view illustrating a portion (e.g., a semiconductor package) of FIG. 3A.
Figure 3D:
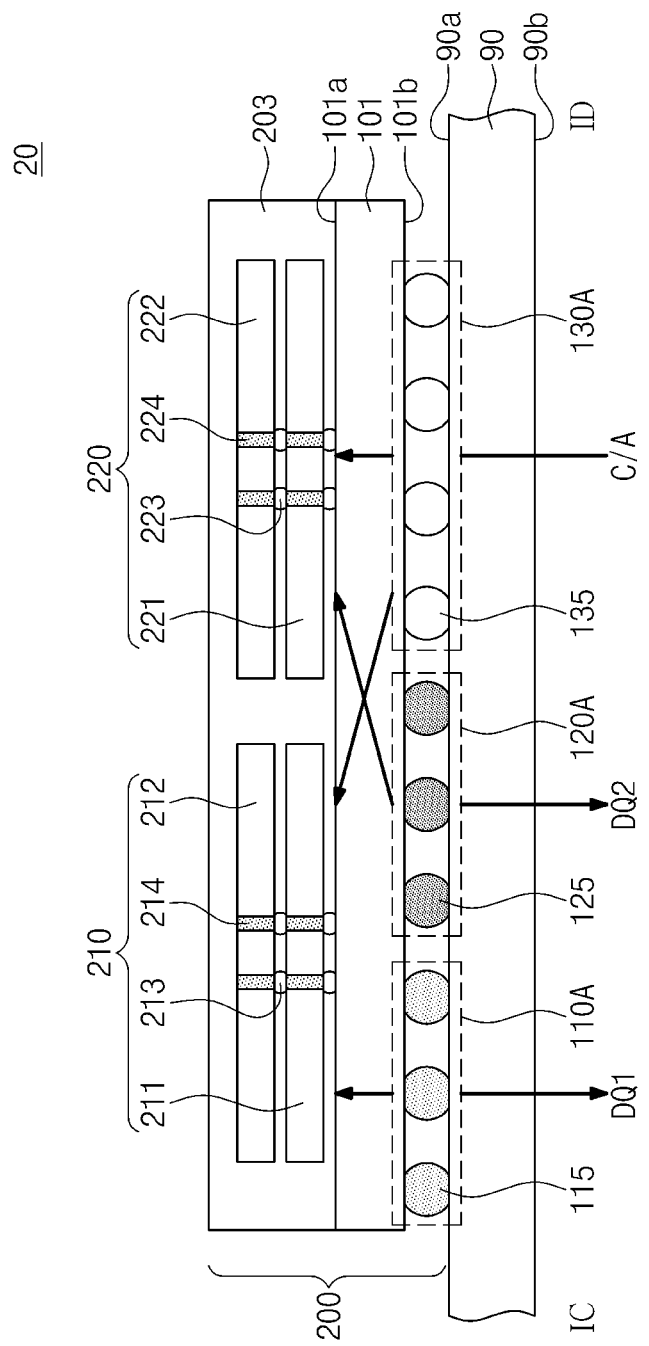
FIG. 3D is a sectional view taken along line IC-ID of FIG. 3C.
Figure 3E:
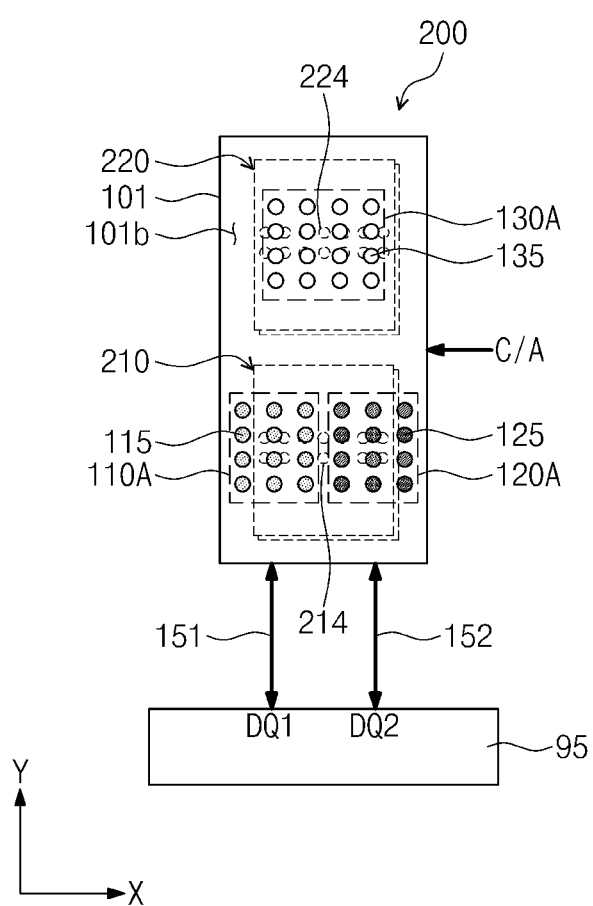
FIGS. 3E and 3F are bottom plan views illustrating modified examples of FIG. 3C.
Figure 3F:
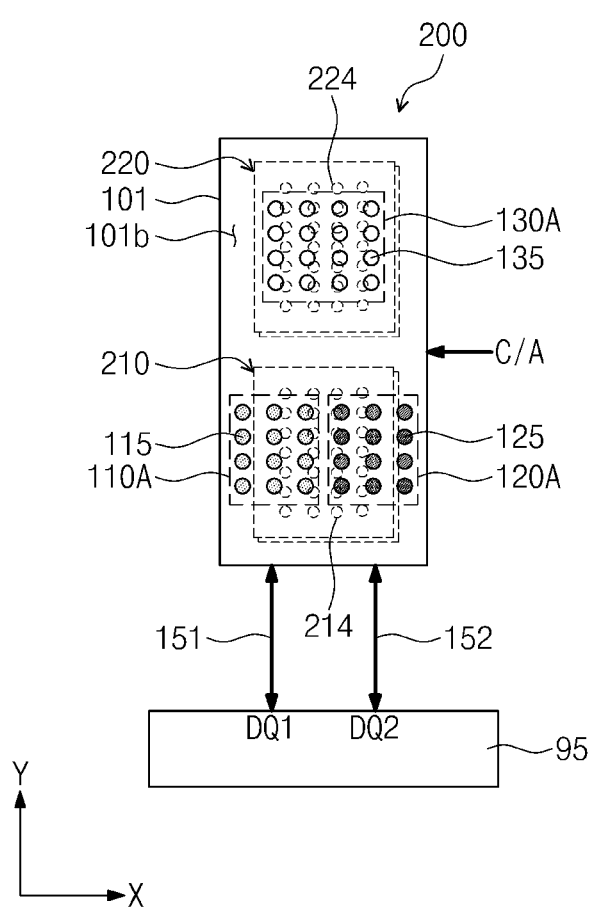

FIG. 3A is a plan view illustrating a semiconductor module according to some embodiments. FIG. 3B is a top plan view illustrating a portion (e.g., a semiconductor package) of FIG. 3A. FIG. 3C is a bottom plan view illustrating a portion (e.g., a semiconductor package) of FIG. 3A. FIG. 3D is a sectional view taken along line IC-ID of FIG. 3C. FIGS. 3E and 3F are bottom plan views illustrating modified examples of FIG. 3C.

Referring to FIG. 3A, a semiconductor module 20 may have a structure similar to the semiconductor module 10 of FIG. 1A. The semiconductor module 20 may include multiple semiconductor packages 200, which are provided on the top surface 90a of the module substrate 90 and are arranged in the first direction X. In some embodiments, multiple semiconductor packages 200 may be further provided on the bottom surface 90b of the module substrate 90.

Referring to FIGS. 3B and 3D, the semiconductor package 200 may be mounted on the top surface 101a of the single package substrate 101 and may include at least two chip stacks 210 and 220, which are encapsulated with a mold layer 203. The first chip stack 210 and the second chip stack 220 may be arranged in the second direction Y.

The first chip stack 210 may be stacked on the top surface 101a of the package substrate 101 may include a first lower semiconductor chip 211 and a first upper semiconductor chip 212. The first chip stack 210 may include at least one first through electrode 214, which is provided in each the first lower semiconductor chip 211 and the first upper semiconductor chip 212. For example, the first through electrode 214 may be provided to penetrate at least a portion of each of the first lower semiconductor chip 211 and the first upper semiconductor chip 212. First connection terminals 213 (e.g., solder balls or solder bumps) may be provided between the first lower semiconductor chip 211 and the package substrate 101 and between the first lower semiconductor chip 211 and the first upper semiconductor chip 212 and may be electrically connected to the first through electrodes 214. The first lower semiconductor chip 211 and the first upper semiconductor chip 212 may be electrically connected to each other and/or to the package substrate 101 through the first through electrodes 214. In some embodiments, at least one semiconductor chip may be further stacked on the first upper semiconductor chip 212.

The second chip stack 220 may have a same or similar structure as the first chip stack 210. For example, the second chip stack 220 may be stacked on the top surface 101a of the package substrate 101 and may include a second lower semiconductor chip 221, a second upper semiconductor chip 222, second connection terminals 223 and second through electrodes 224 similar to corresponding structures of the first chip stack 210.

In addition to the above features, the semiconductor module of FIGS. 3C and 3D may be configured to have substantially the same features as that of FIGS. 1C and 1D. In some embodiments, as described previously with reference to FIG. 2A, the semiconductor module 20 may include the common connection region 130A and the mixed data connection region 140A.

As shown in FIG. 3B or 3C, the first through electrodes 214 may be arranged on a center region, which is elongated in the second direction Y, of the first chip stack 210 to form one or more columns parallel to the second direction Y. Similarly, the second through electrodes 224 may be arranged on a center region, which is elongated in the second direction Y, of the second chip stack 220 to form one or more columns parallel to the second direction Y. The first through electrodes 214 and the second through electrodes 224 may be provided to be aligned in the second direction Y.

Alternatively, as shown in FIG. 3E, the first through electrodes 214 may be arranged on a center region, which is elongated in the first direction X, of the first chip stack 210 to form one or more columns parallel to the first direction X. Similarly, the second through electrodes 224 may be arranged on a center region, which is elongated in the first direction X, of the second chip stack 220 to form one or more columns parallel to the first direction X. In some embodiments, as shown in FIG. 3F, the first through electrodes 214 and the second through electrodes 224 may be arranged in a mesh or grid shape.

Figure 4A:
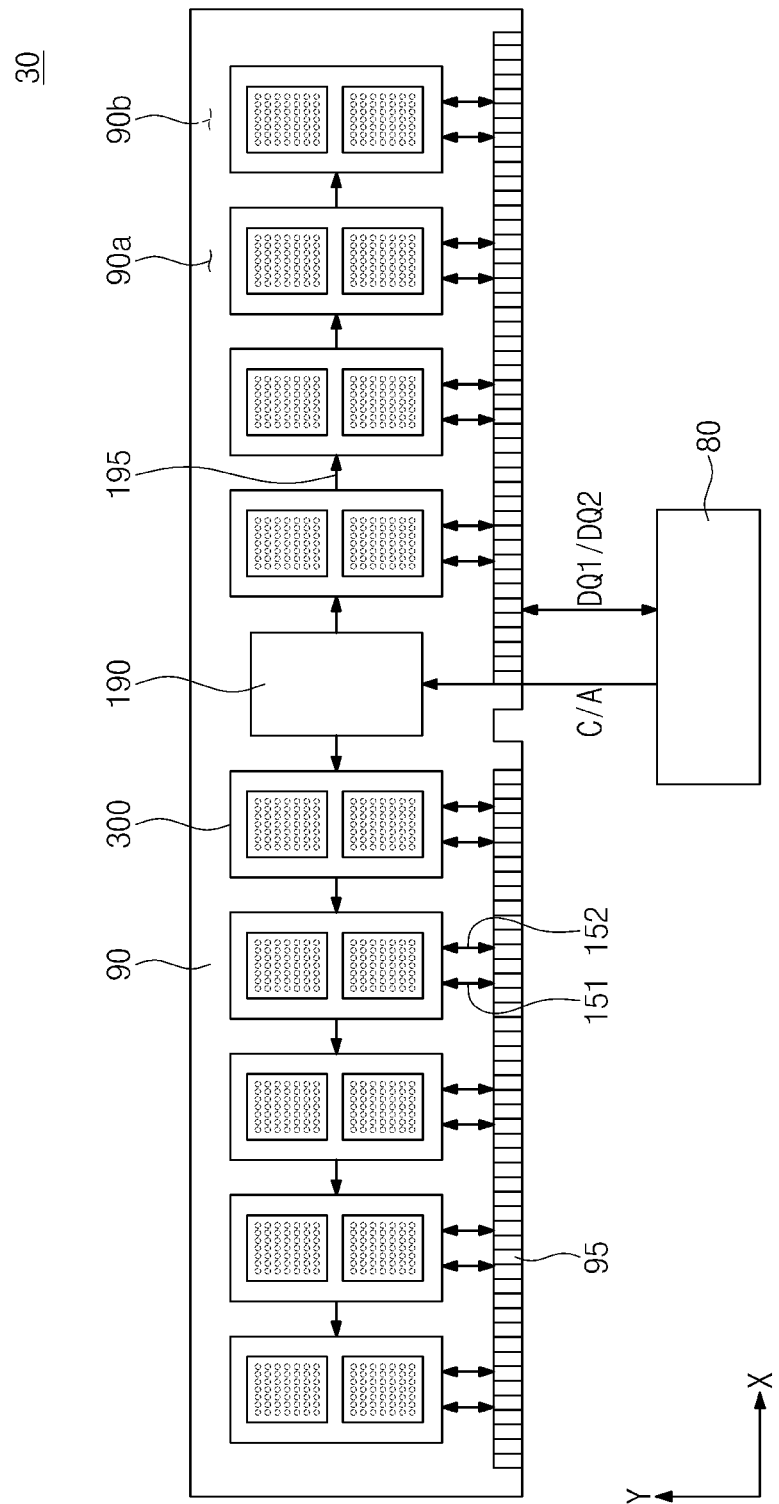
FIG. 4A is a plan view illustrating a semiconductor module according to some embodiments.
Figure 4B:
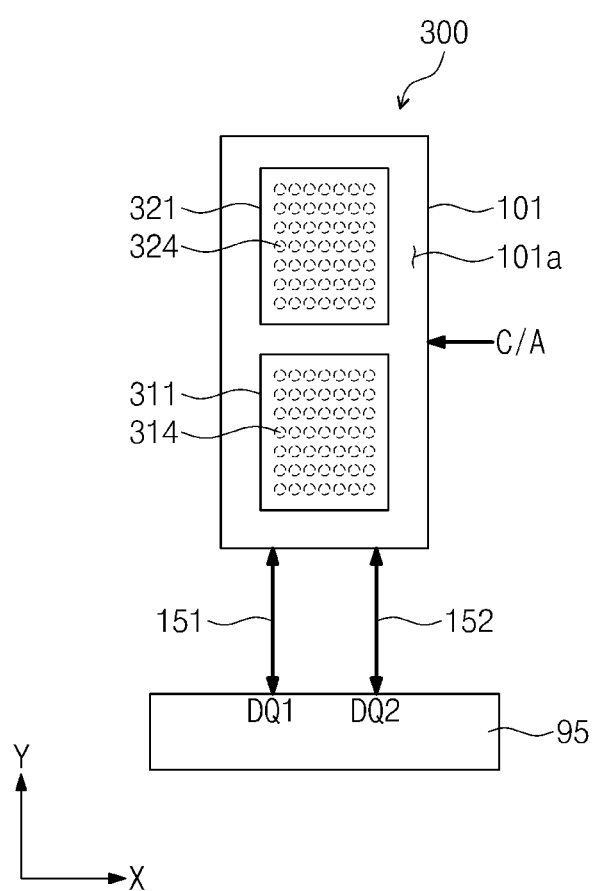
FIG. 4B is a top plan view illustrating a portion (e.g., a semiconductor package) of FIG. 4A.
Figure 4C:
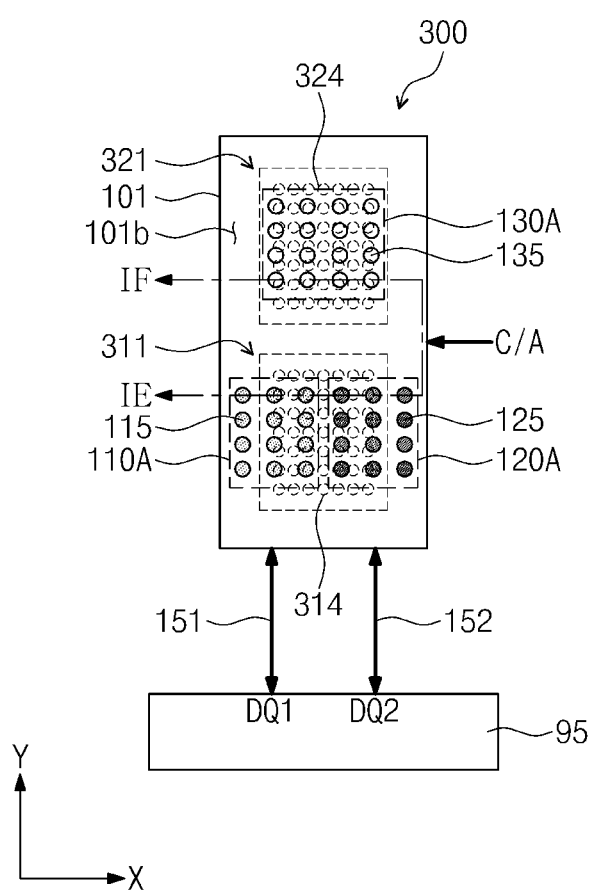
FIG. 4C is a bottom plan view illustrating a portion (e.g., a semiconductor package) of FIG. 4A.

FIG. 4A is a plan view illustrating a semiconductor module according to some embodiments. FIG. 4B is a top plan view illustrating a portion (e.g., a semiconductor package) of FIG. 4A. FIG. 4C is a bottom plan view illustrating a portion (e.g., a semiconductor package) of FIG. 4A. FIG. 4D is a sectional view taken along line IE-IF of FIG. 4C.

Referring to FIG. 4A, a semiconductor module 30 may have a structure similar to the semiconductor module 10 of FIG. 1A. The semiconductor module 30 may include multiple semiconductor packages 300, which are arranged in the first direction X on at least one of the top and bottom surfaces 90a and 90b of the module substrate 90.

Referring to FIGS. 4B and 4D, the semiconductor package 300 may have a single-layered structure. For example, the semiconductor package 300 may include a first semiconductor chip 311 and a second semiconductor chip 321, which are arranged in the second direction Y on the top surface 101a of the package substrate 101 and are encapsulated with a mold layer 303. In some embodiments, the first semiconductor chip 311 and the second semiconductor chip 321 may be mounted on the package substrate 101 in a flip-chip manner The first semiconductor chip 311 may be electrically connected to the package substrate 101 through one or more first connection terminals 314 (e.g., solder balls or solder bumps). The first semiconductor chip 311 may include first chip pads 316 coupled to the first connection terminals 314. Similarly, the second semiconductor chip 321 may be electrically connected to the package substrate 101 through one or more second connection terminals 324 (e.g., solder balls or solder bumps). The second semiconductor chip 321 may include second chip pads 326 coupled to the second connection terminals 324.

Referring to FIGS. 4C and 4D, the bottom surface 101b of the package substrate 101 and a structure thereon may be the same as or similar to that described with reference to FIGS. 1C and 1D. For example, the semiconductor module 30 may include the first and second data connection regions 110A and 120A, which are adjacent to the connector 95, and the common connection region 130A, which is farther away from the connector 95. In addition to the above features, the semiconductor module of FIGS. 4C and 4D may be configured to have substantially the same or similar features as that of FIGS. 1C and 1D. In some embodiments, as described previously with reference to FIG. 2A, the semiconductor module 30 may include the common connection region 130A and the mixed data connection region 140A.

Figure 5B:
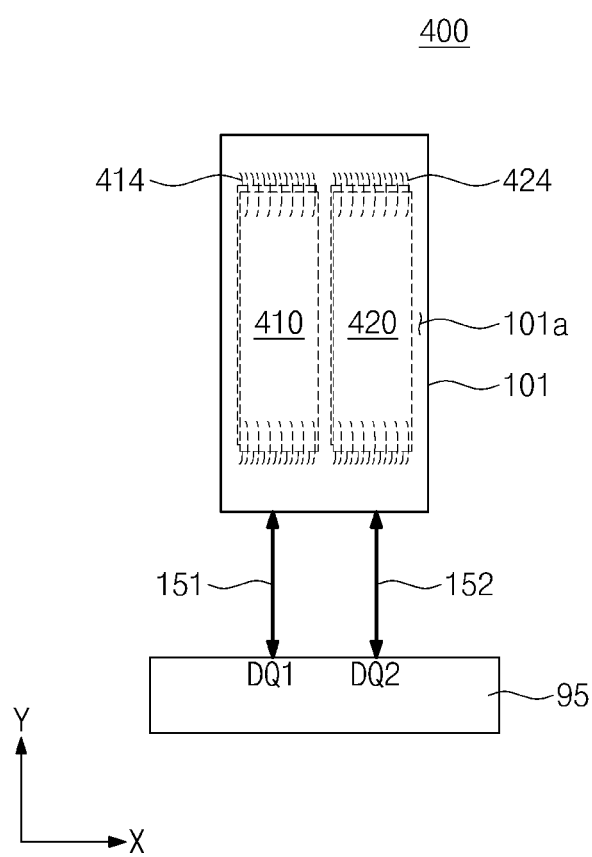
FIG. 5B is a top plan view illustrating a portion (e.g., a semiconductor package) of FIG. 5A.
Figure 5C:
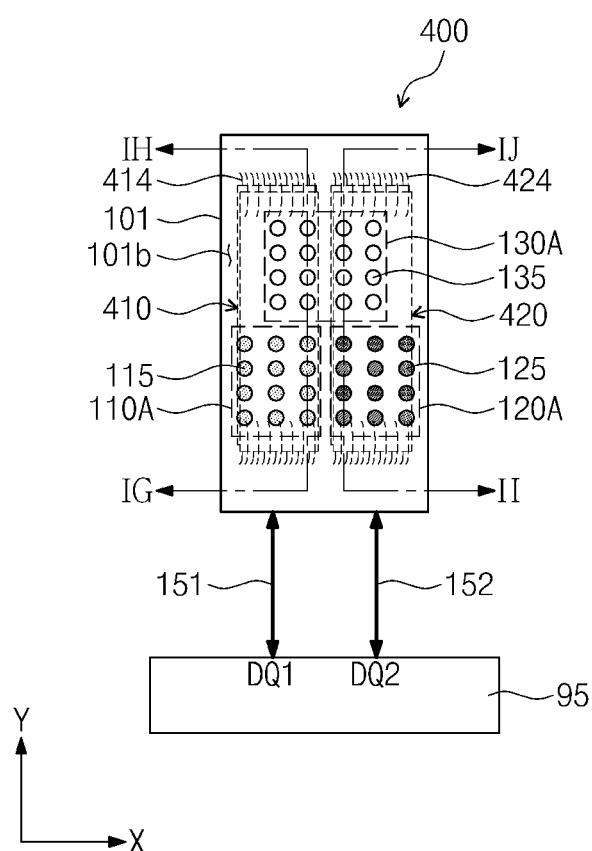
FIG. 5C is a bottom plan view illustrating a portion (e.g., a semiconductor package) of FIG. 5A.
Figure 5D:
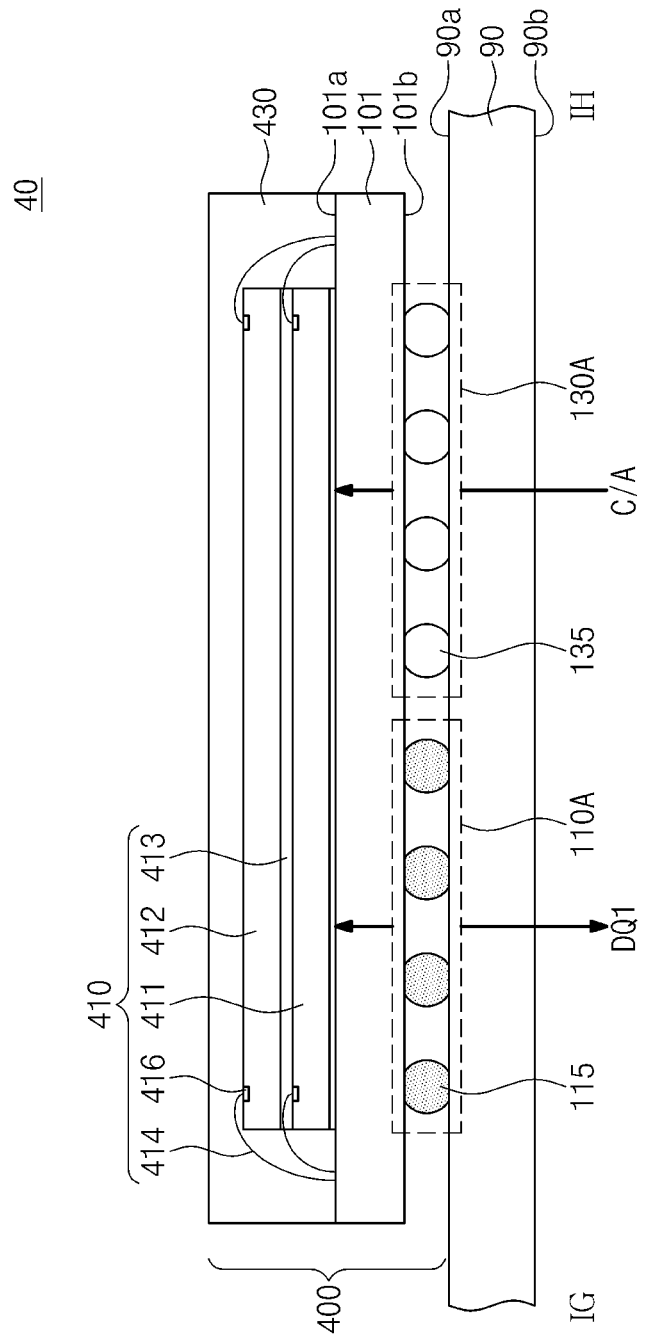
FIG. 5D is a sectional view taken along line IG-IH of FIG. 5C.
Figure 5E:
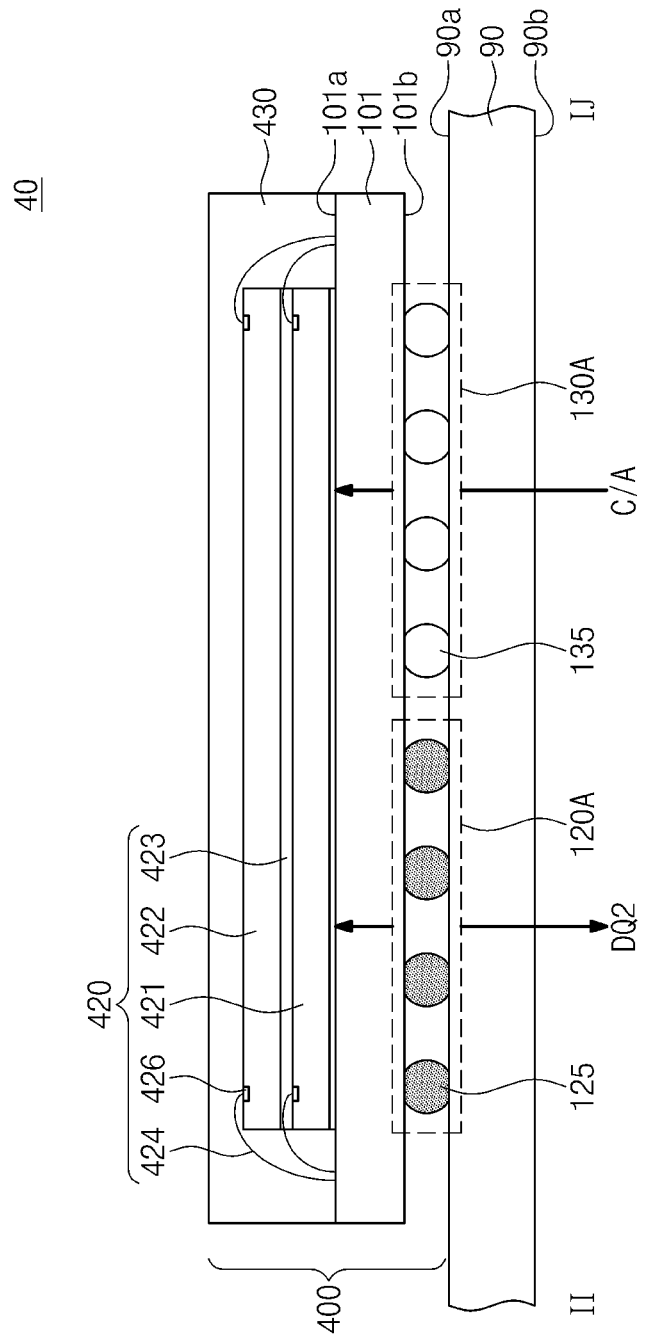
FIG. 5E is a sectional view taken along line II-IJ of FIG. 5C.

FIG. 5A is a plan view illustrating a semiconductor module according to some embodiments. FIG. 5B is a top plan view illustrating a portion (e.g., a semiconductor package) of FIG. 5A. FIG. 5C is a bottom plan view illustrating a portion (e.g., a semiconductor package) of FIG. 5A. FIG. 5D is a sectional view taken along line IG-IH of FIG. 5C. FIG. 5E is a sectional view taken along line II-IJ of FIG. 5C.

Referring to FIG. 5A, a semiconductor module 40 may have a structure similar to the semiconductor module 10 of FIG. 1A. The semiconductor module 40 may include multiple semiconductor packages 400, which are arranged in the first direction X on at least one of the top and bottom surfaces 90a and 90b of the module substrate 90.

Referring to FIG. 5B, the semiconductor package 400 may be provided on the top surface 101a of the package substrate 101 and may include a first chip stack 410 and a second chip stack 420 encapsulated with the mold layer 403 (e.g., see FIG. 5D or 5E). The first and second chip stacks 410 and 420 may be arranged in the first direction X. For example, if a size of the semiconductor package 400 or the semiconductor module 40 is not strongly dependent on some dimensions (e.g., lengths in the first direction X) of the semiconductor chips provided in the first and second chip stacks 410 and 420, the first and second chip stacks 410 and 420 may be arranged in the first direction X.

As shown in FIG. 5D, the first chip stack 410 may include a first lower semiconductor chip 411 and a first upper semiconductor chip 412, which are stacked on the top surface 101a of the package substrate 101, a first adhesive layer 413, which is used to attach the first lower semiconductor chip 411 to the first upper semiconductor chip 412 and attach the first lower semiconductor chip 411 to the package substrate 101, and first bonding wires 414, which are used to electrically connect the first lower semiconductor chip 411 and the first upper semiconductor chip 412 to the package substrate 101. The first lower semiconductor chip 411 and the first upper semiconductor chip 412 may include first chip pads 416 electrically connected to the first bonding wires 414. Each of the first bonding wires 414 may extend in the second direction Y, as shown in FIG. 5B.

As shown in FIG. 5E, the second chip stack 420 may include a second lower semiconductor chip 421 and a second upper semiconductor chip 422, which are stacked on the top surface 101a of the package substrate 101, a second adhesive layer 423, which is used to attach the second lower semiconductor chip 421 to the second upper semiconductor chip 422 and attach the second lower semiconductor chip 421 to the package substrate 101, and second bonding wires 424, which are used to electrically connect the second lower semiconductor chip 421 and the second upper semiconductor chip 422 to the package substrate 101. The second lower semiconductor chip 421 and the second upper semiconductor chip 422 may include second chip pads 426 electrically connected to the second bonding wires 424. Each of the second bonding wires 424 may extend in the second direction Y, as shown in FIG. 5B.

Referring to FIGS. 5C, 5D, and 5E, the bottom surface 101b of the package substrate 101 and a structure thereon may be the same as or similar to that described with reference to FIGS. 1C and 1D. In addition to the above features, the semiconductor module of FIGS. 5C to 5E may be configured to have substantially the same or similar features as that of FIGS. 1C and 1D. In some embodiments, as described previously with reference to FIG. 2A, the semiconductor module 40 may include the common connection region 130A and the mixed data connection region 140A.

According to some embodiments, multiple semiconductor packages are integrated into a single semiconductor package, and thus, it is possible to reduce a total size of the semiconductor package and to reduce a size of a semiconductor module. Furthermore, connection terminals may be arranged to reduce or minimize a length of a routing path, and thus, it is possible to improve a data processing speed of the semiconductor module.

While particular embodiments have been shown and described, it will be understood by one of ordinary skill in the art that variations in form and detail may be made therein without departing from the spirit and scope of the attached claims.

What is claimed is:

1. A semiconductor package, comprising:
a package substrate;
at least one of first semiconductor chip stacked on a top surface of the package substrate, the first semiconductor chip has a plurality of first through electrodes penetrating at least a portion of the first semiconductor chip;
at least one of second semiconductor chip stacked on the top surface of the package substrate, the second semiconductor chip has a plurality of second through electrodes penetrating at least a portion of the second semiconductor chip; and
a plurality of electric connection elements provided on a bottom surface of the package substrate and electrically connected to the first and second semiconductor chips,
wherein the first semiconductor chip and the second semiconductor chip arranged so as to be adjacent to each other in a first direction parallel to the top surface of the package substrate,
wherein the plurality of electric connection elements comprise:
a plurality of first connection elements electrically connected to data signal terminals of each of the first and second semiconductor chips; and
a plurality of second connection elements electrically connected to command/address signal terminals of each of the first and second semiconductor chips,
wherein the package substrate comprises:
a first connection region that is provided on the bottom surface of the package substrate and on which the first connection elements are arranged; and
a second connection region that is provided on the bottom surface of the package substrate and on which the second connection elements are arranged,
wherein the first connection region the second connection region are arranged in the first direction.

2. The semiconductor package of claim 1, wherein the first connection region comprises:
a first data connection region electrically connected to data signal terminals of the first semiconductor chip; and
a second data connection region electrically connected to data signal terminals of the second semiconductor chip.

3. The semiconductor package of claim 2, wherein the first data connection region and the second data connection region are arranged in a second direction perpendicular to the first direction on the bottom surface of the package substrate.

4. The semiconductor package of claim 1, further comprises a module substrate with an electric connection element,
    wherein the semiconductor package is mounted on the module substrate, and
    wherein the electric connection element of the module substrate is disposed in the first direction from the semiconductor package.

5. The semiconductor package of claim 4, wherein:
    the module substrate comprises a top surface and a bottom surface opposite to each other; and
    the semiconductor package is provided on at least one of the top or bottom surfaces of the module substrate.

6. The semiconductor package of claim 1, wherein:
    the first semiconductor chip further comprises a plurality of first connection terminals that electrically connect the first semiconductor chip to a package substrate and are provided between the first semiconductor chip and the package substrate, and
    wherein the second semiconductor chip further comprises a plurality of second connection terminals that electrically connect the second semiconductor chip to a package substrate and are provided between the second semiconductor chip and the package substrate.

7. The semiconductor package of claim 1, wherein the first connection elements are interleaved with the second connection elements.

8. A semiconductor module, comprising:
    a module substrate;
    a plurality of semiconductor packages on a top surface of the module substrate, the plurality of semiconductor packages being arranged so as to be adjacent to each other in a first direction;
    a buffer chip between the plurality of semiconductor packages on the module substrate; and
    an electric connection element on the module substrate and extending in the first direction,
    wherein each of the semiconductor packages comprises:
        a package substrate; and
        a plurality of semiconductor chips provided on the top surface of the package substrate and arranged in a second direction crossing the first direction,
    wherein the package substrate of each of the semiconductor packages comprises:
        a first region electrically connected between data signal terminals of the semiconductor chips and the module substrate; and
        a second region electrically connected between command/address signal terminals of the semiconductor chips and the module substrate,
    wherein the first region is closer to the electric connection element of the module substrate, compared with the second region.

9. The semiconductor module of claim 8, wherein the first region comprises:
    a first data connection region electrically connected to data signal terminals of a first chip of the semiconductor chips and the module substrate; and
    a second data connection region electrically connected to data signal terminals of a second chip of the semiconductor chips and the module substrate.

10. The semiconductor module of claim 9, wherein the first data connection region and the second data connection region are arranged in the first direction on a bottom surface of the package substrate.

11. The semiconductor module of claim 9, wherein the first and second region is provided on a bottom surface of the package substrate; and
    the first and second data connection regions are arranged with the second region so as to be adjacent to one another in the first direction.

12. The semiconductor module of claim 8, wherein the electric connection element on the module substrate is arranged in the second direction from the semiconductor packages.

13. The semiconductor module of claim 8, wherein the first region is closer to the electric connection element of the module substrate, compared with the second region.

14. The semiconductor module of claim 8, wherein each of the semiconductor packages further comprises a plurality of bonding wires electrically connecting the semiconductor chips to a package substrate.

15. The semiconductor module of claim 8, wherein each of the semiconductor packages further comprises a plurality of through electrodes electrically connecting the semiconductor chips to a package substrate and penetrating at least a portion of the semiconductor chips, respectively.

16. The semiconductor module of claim 15, wherein each of the semiconductor packages further comprises a plurality of connection terminals that electrically connect the semiconductor chips to a package substrate and are provided between the semiconductor chips and the package substrate.

17. A semiconductor module, comprising:
    a module substrate with an electric connection element;
    a semiconductor package on the module substrate; and
    a connection region electrically connecting the semiconductor package to the module substrate;
    wherein the semiconductor package comprises:
        a package substrate;
        semiconductor chips provided on a top surface of the package substrate and arranged in a first direction; and
        through electrodes electrically connecting the semiconductor chips to the package substrate and penetrating at least a portion of the semiconductor chips, respectively,
    wherein the connection region comprises:
        a first region electrically connected between data signal terminals of a first chip of the semiconductor chips of the semiconductor package and the module substrate;
        a second region electrically connected between data signal terminals of a second chip of the semiconductor chips of the semiconductor package and the module substrate; and
        a third region electrically connected between command/address signal terminals of both the first and second chips of the semiconductor package and the module substrate,
    wherein the first region and the second chip are closer to the electric connection element of the module substrate, compared with the third region.

18. The semiconductor module of claim 17, wherein the first and second regions are arranged in a second direction perpendicular to the first direction.

19. The semiconductor module of claim 17, wherein the connection region is provided on a bottom surface of the package substrate; and
    the first and third regions of the connection region are arranged in the first direction.

20. The semiconductor module of claim 17, wherein:
the first region comprises a plurality of first connection elements;
the second region comprises a plurality of second connection elements; and
the first connection elements are interleaved with the second connection elements.

* * * * *